(12) United States Patent
Bjuggren et al.

(10) Patent No.: US 7,365,829 B2
(45) Date of Patent: Apr. 29, 2008

(54) METHOD AND APPARATUS FOR IMAGE FORMATION

(75) Inventors: Måns Bjuggren, Täby (SE); Lars Ivansen, Solna (SE); Lars Stiblert, Göteborg (SE)

(73) Assignee: Micronic Laser Systems AB, Taby (SE)

( * ) Notice: Subject to any disclaimer, the term of this patent is extended or adjusted under 35 U.S.C. 154(b) by 191 days.

(21) Appl. No.: 10/498,590

(22) PCT Filed: Dec. 10, 2002

(86) PCT No.: PCT/SE02/02267

§ 371 (c)(1),
(2), (4) Date: Jun. 10, 2004

(87) PCT Pub. No.: WO03/054632

PCT Pub. Date: Jul. 3, 2003

(65) Prior Publication Data

US 2005/0082496 A1 Apr. 21, 2005

(51) Int. Cl.
*G03B 27/54* (2006.01)
*G03B 27/42* (2006.01)
*G06F 17/50* (2006.01)

(52) U.S. Cl. ............................. 355/67; 355/53; 716/19

(58) Field of Classification Search ................. 355/69, 355/67, 53, 72, 75, 77; 359/618, 855, 292; 716/19
See application file for complete search history.

(56) References Cited

U.S. PATENT DOCUMENTS

| | | | | |
|---|---|---|---|---|
| 6,312,134 B1 * | 11/2001 | Jain et al. | ................... | 359/855 |
| 6,421,180 B1 * | 7/2002 | Montgomery et al. | ...... | 359/618 |
| 2003/0099026 A1 * | 5/2003 | Sandstrom | .................. | 359/292 |
| 2004/0268289 A1 * | 12/2004 | Sandstrom et al. | ........... | 716/19 |

FOREIGN PATENT DOCUMENTS

WO  WO 00/72090 A2 * 11/2000

\* cited by examiner

*Primary Examiner*—Peter B. Kim
(74) *Attorney, Agent, or Firm*—Ernest J. Beffel, Jr.; Haynes Beffel & Wolfeld LLP (57) ABSTRACT

The present invention relates to a method for adjusting a pattern to be imaged onto a workpiece. The pattern representing an image is divided in a plurality of regions. A pattern density in said plurality of region is computed. At least one feature in at least one of said plurality of regions is adjusted based on the pattern density in at least one other region. An adjusted pattern is fed to a modulator. The image is created on said workpiece by using said corrected pattern. The invention also relates to an apparatus for imaging adjusted pattern on a workpiece, a semiconducting wafer to be imaged with an adjusted pattern and a mask or a reticle to be imaged with an adjusted pattern.

30 Claims, 5 Drawing Sheets

METHOD AND APPARATUS FOR IMAGE FORMATION

FIELD OF THE INVENTION

The present invention relates in general to a method for enhancing the pattern to be imaged onto a workpiece, in particular it relates to a method for compensating images for proximity effects.

BACKGROUND OF THE INVENTION

Present day mask, reticle or integrated circuit processing techniques often employ lithography processing, such as electron beam, laser and X-ray lithography, to write ultra small geometries onto a workpiece. The structures on the workpiece (a semi conducting substrate or chromium on a transparent substrate) are formed by exposure to electromagnetic radiation or an electron beam of a photosensitive or electron-sensitive covering on the workpiece.

A wafer may be processed either by direct writing or using masks and/or reticles. Wafers may be exposed to ultraviolet light through one or a plurality of masks and thereby transferring the pattern formed on the masks onto the wafer.

A common aspect of all known pattern generators is that the pattern is described in digital data bank containing a list of all structure or pattern elements with their geometrical data. Before the structures are written, the geometrical data are converted to a format, which is used by the writing hardware. During that conversion operation geometrical coordinates are truncated to the addressing resolution of the hardware, that is to say the writing address grid.

Most modern pattern generators use a raster scan principle with a scanning beam which is either an electron beam, X-ray beam or a laser beam and which is deflected along parallel lines on the substrate which is covered with a radiation sensitive covering. The beam is switched on and off in accordance with a bitmap for the structure, which is stored in a control system. Another option is that the beam is produced during a writing time, which is derived from a data stored in an intermediate compressed format. A pattern generator of the kind described above can be found in patent application WO 98/33096, filed by the same assignee as the present invention.

Another type of pattern generator is described in patent application WO 99/45439, also filed by the same assignee as the present application, which uses a spatial light modulator (SLM) of the micromirror type in order to produce the pattern on the workpiece. The use of an SLM in a pattern generator has a number of advantages compared to the described method above of using scanning laser spots. The SLM is a massively parallel device and the number of pixels that can be written per second is extremely high. The optical system is also simpler in the sense that the illumination of the SLM is non-critical, while in the laser scanner the entire beam path has to be built with high precision. Compared to some types of scanners, in particular electrooptic and acoustooptic ones, the micromirror SLM can be used at shorter wavelengths since it is a purely reflective device. The SLM may also be of transmissive type. The reflective SLM works in principle either in deflection mode or in phase mode, where the phase SLM extinguishes the beam in a specular direction by destructive interference, while a pixel in a deflection SLM deflects the specular beam geometrically to one side so that it misses an aperture of an imaging lens.

However, the pattern transferred to the workpiece becomes most likely different from the mask pattern, owing to diffraction of light in the corners of features in said mask pattern. Said effect is often termed as laser proximity effect.

When two areas are close together, there may be a cross dosing of the writing energy (electrons, photons), causing an undesirable increase of the adjacent portions of the written areas. This unwanted exposure of a feature by one or more of its neighbors, termed the optical proximity effect, constitutes the fundamental limit to resolution in lithography processing. Compensation or correction of proximity effect requires an alteration of the representation of an image to be patterned.

In a wafer lithography process there might be useful to correct for process dependent parameters such as that the resist is not having the same properties over the whole wafer, correction of lens artifacts and under etching etc.

In recent years, with the reduction in the size of patterns of integrated circuits, it is required to control the pattern size more precisely.

In practice, however, there occurs pattern deformation like those described above, the effect of which become increasingly important. A problem, which seems to be more and more important, is that a feature in one image will most probably be corrected differently compared to if said feature is present in another image. There is therefore a need in the art for a method, which corrects for proximity effects taking into account the pattern to be printed.

SUMMARY OF THE INVENTION

Accordingly, it is an object of the present invention to provide a method for proximity correction, which overcomes or at least reduces the above-mentioned problem.

This object, among others, is according to a first aspect of the invention attained by a method for correcting a pattern to be imaged onto a workpiece, where a pattern representing an image is divided in a plurality of regions. A pattern density is computed in said plurality of regions. At least one feature in at least one of said plurality of regions is adjusted based on the pattern density in said region and in at least one other region. A corrected pattern is fed to a modulator. The image is created on said workpiece by using said corrected pattern.

In another embodiment of the invention said at least one other region is adjacent to the region in which said at least one feature is to be adjusted.

In yet another embodiment of the invention said at least one other region is non-adjacent to the region in which said at least one feature is to be adjusted.

In yet another embodiment of the invention other regions are adjacent and non-adjacent to the region in which said at least one feature is to be adjusted.

In yet another embodiment of the invention said modulator is at least one Acoustic Optical Modulator (AOM).

In still another embodiment of the invention said modulator is at least one Spatial Light Modulator (SLM).

In yet another embodiment of the invention said at least one SLM is illuminated by a pulsed electromagnetic radiation source.

In yet another embodiment of the invention said workpiece is a mask or a reticle.

In yet another embodiment of the invention said workpiece is a semi conducting substrate.

In yet another embodiment of the invention said regions are non-overlapping.

In yet another embodiment of the invention said regions are at least partly overlapping each other.

In yet another embodiment of the invention said at least one feature is adjusted by dose.

In yet another embodiment of the invention said at least one feature is adjusted by size.

In yet another embodiment of the invention said at least one feature is adjusted by size and dose.

In yet another embodiment of the invention said regions are of polygonal shape.

The invention also relates to an apparatus for imaging corrected pattern onto a workpiece. Said apparatus comprising an electromagnetic radiation source, a modulator to modulate said electromagnetic radiation according to a digital representation of the pattern to be imaged, a calculator to calculate pattern densities in plurality of regions, which said pattern is divided into, a feature corrector to correct at least one feature to be imaged depending on the density in a region where said feature is located and in at least one other region.

In another embodiment said at least one other region is adjacent to the region in which said at least one feature is to be adjusted.

In another embodiment said at least one other region is non-adjacent to the region in which said at least one feature is to be adjusted.

In another embodiment regions are both adjacent and non-adjacent to the region in which said at least one feature is to be adjusted.

In another embodiment said modulator is at least one Acoustic Optical Modulator (AOM).

In another embodiment said modulator is at least one Spatial Light Modulator (SLM).

In another embodiment said at least one SLM is illuminated by a pulsed electromagnetic radiation source.

In another embodiment said workpiece is a mask or a reticle.

In another embodiment said workpiece is a semi conducting substrate.

In another embodiment said regions are non-overlapping.

In another embodiment said regions are at least partly overlapping each other.

In another embodiment said at least one feature is adjusted by dose.

In another embodiment said at least one feature is adjusted by size.

In another embodiment said at least one feature is adjusted by size and dose.

In another embodiment said regions are of polygonal shape.

In another embodiment said density is calculated only for a portion of said plurality of regions before said image is created.

In another embodiment the densities for remaining regions are calculated while creating said image.

The invention also relates to a semi conducting wafer to be imaged with a pattern, comprising a least partly a coating sensitive to electromagnetic radiation, wherein said pattern representing an image is divided into a plurality of regions, a density of the pattern is calculated for at least a portion of said regions, at least one feature in at least one of said plurality of regions is adjusted based on the pattern density in a region where said feature which is to be imaged is located and in at least one other region, a modulator illuminated by an electromagnetic radiation source is fed with a digital representation of said adjusted pattern to create said adjusted image on said wafer.

The invention also relates to a mask or a reticle to be imaged with a pattern, comprising a least partly a coating sensitive to electromagnetic radiation, wherein said pattern representing an image is divided into a plurality of regions, a density of the pattern is calculated for at least a portion of said regions, at least one feature in at least one of said plurality of regions is adjusted based on the pattern density in a region where said feature which is to be imaged is located and in at least one other region, a modulator illuminated by an electromagnetic radiation source is fed with a digital representation of said adjusted pattern to create said adjusted image on said wafer.

Other aspects, characteristics and advantages of the present invention are reflected in the detailed description, figures and claims.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1A:
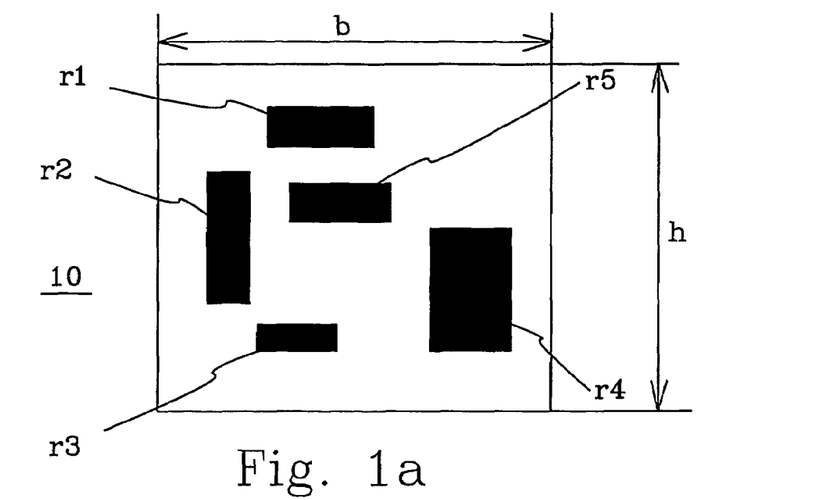
FIG. 1a depicts a top view of a two dimensional pattern.

FIG. 1a illustrates a two dimensional pattern of area features on for example a semiconductor wafer, a mask or a reticle having a height h and a width b. In order to facilitate the present description and to simplify the drawings, the two dimensional pattern 10 of area features shown in FIG. 1a is illustrated as being comprised of five randomly distributed rectangles r1, r2, r3, r4, r5. It will be understood, of course, that a typical area feature pattern for lithography processing of a semiconductor wafer may comprise several million area features, which may vary in size, shape and location. Thus, the parametric units employed in the present description are not to be considered limitative of the invention or equated with a specific area feature pattern to be employed for an actual lithography process, but are employed to facilitate an understanding of the improved compensation method.

The two dimensional pattern of area features may be of vector format shapes, including, but not limited to, rectangles and trapezoids. Single shapes or a plurality of shapes can be reused in one- or two-dimensional arrays. The arrays can be nested, so that each array in turn may contain any number of arrays or shapes, which in turn may contain arrays or shapes. There is no limit to the level of nesting.

The shapes may belong to a certain layer. The layers may have a property assigned to it. The property may be a Boolean function, including, but not limited to OR and AND NOT. The property should be applied between the layers to which the property belongs, and a result of all layers prior to the same. This implies that all properties must be processed in strict layer sequence. The pattern may be sorted neither on position nor layer.

Figure 1B:
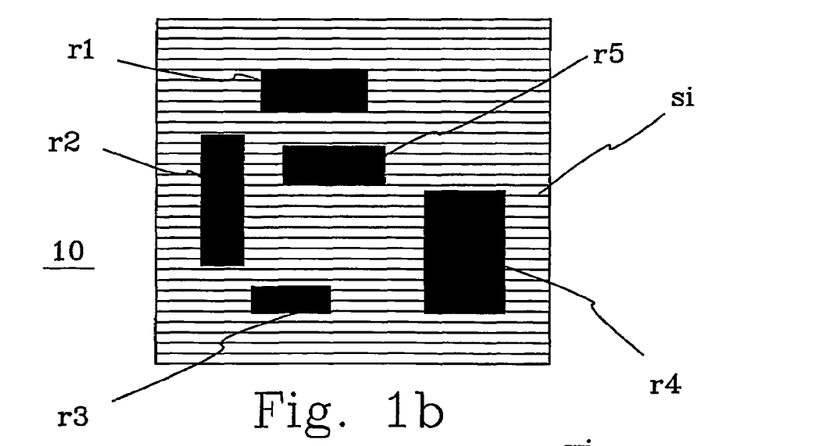
FIG. 1b depicts top view of a fractured two-dimensional pattern.

FIG. 1b illustrates a fractured two-dimensional pattern of area features. The pattern is split into a number of strips $s_i$, in this example 33 strips $s_i$. By splitting said two-dimensional pattern of area features into strips it is possible to rasterize the strips is independently of each other.

Figure 1C:
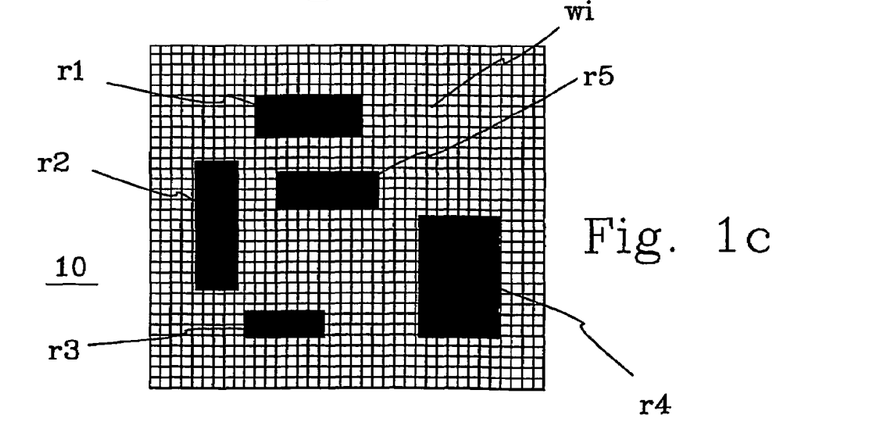
FIG. 1c depicts a top view of a rasterized two-dimensional pattern.

FIG. 1c illustrates a rasterized two-dimensional pattern of area features. This rasterized representation can be directly interpreted by hardware that controls the amplitude and deflection of a laser beam in a scanning pattern generator or that controls the pixels in a spatial light modulator and the dose of illuminating said spatial light modulator. FIG. 1c depicts several windows $w_i$ building up said rasterized two-dimensional pattern of area features. The size of a rectangular window $w_i$ may for example be 50×20 μm.

For each shape, grid elements that fall inside the borders of the feature may be set to Boolean one. This can be determined by imagine a vector from the grid element, stretching to eternity in y-direction. For example, if MOD (crossings) is one, the element is inside the feature, outside otherwise. In case of layers, the layer value is used as an index into a third dimension of the grid. If the feature is part of an array, the array is unfolded according to the pitch and number of inserts defining it. If the arrays are nested, unfold recursive.

When the whole pattern is processed, one will have a three dimensional matrix with Boolean grid elements. The third dimension may be compressed by applying the layer property between the current and the previous layer. The result will be a two dimensional matrix that reflects the density of the pattern.

Figure 3:
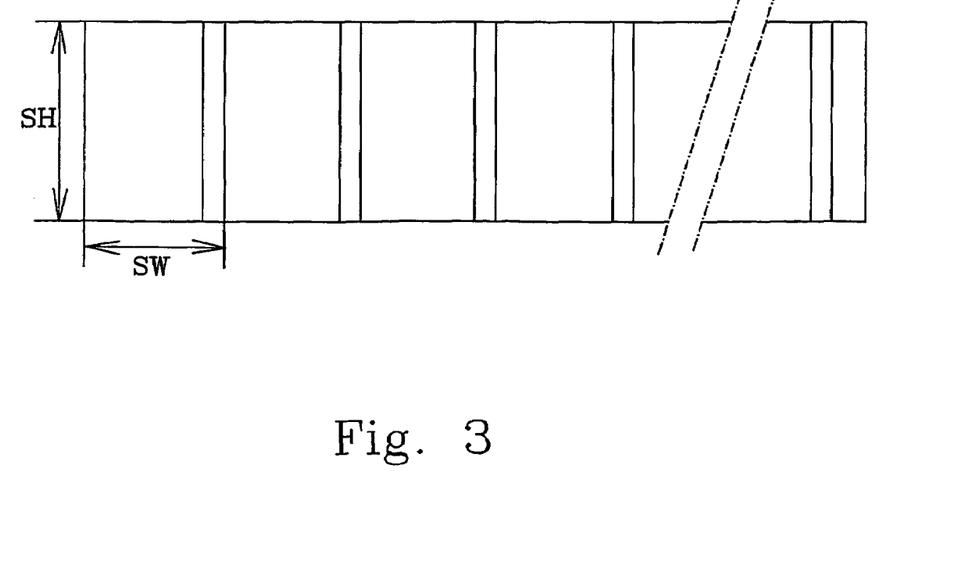
FIG. 3 illustrates a strip of horizontal range of overlapping stamps.
Figure 5:
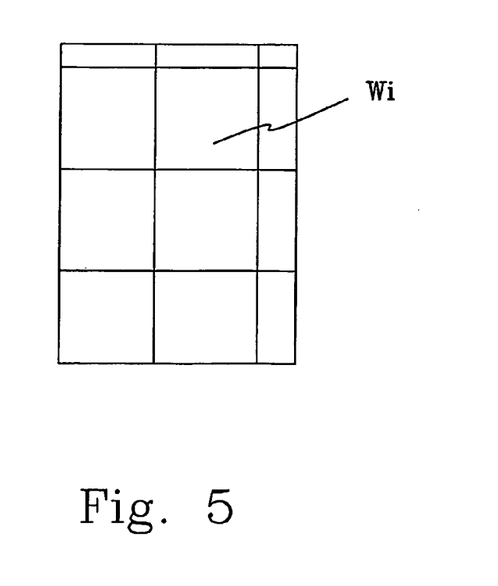
FIG. 5 illustrates that a stamp may comprise a plurality of modulator windows.

FIG. 3 illustrates a strip of horizontal range of overlapping stamps. The stamp may represent the area of an SLM. A stamp may comprise one or a plurality of windows $w_i$ as illustrated in FIG. 5. Preferably a height of stamps, SH, is equal in within a strip. However, the width of the stamps, SW, may vary from stamp to stamp. FIG. 3 also illustrates that said stamps are partly overlapping each other. The reason for partly overlapping the stamps is inter alia to take care of butting errors from the individual stamps. The time order of the stamps in a strip may be randomly distributed or sequential, where the sequential time order can have either left-to-right or right-to-left orientation.

Figure 4:
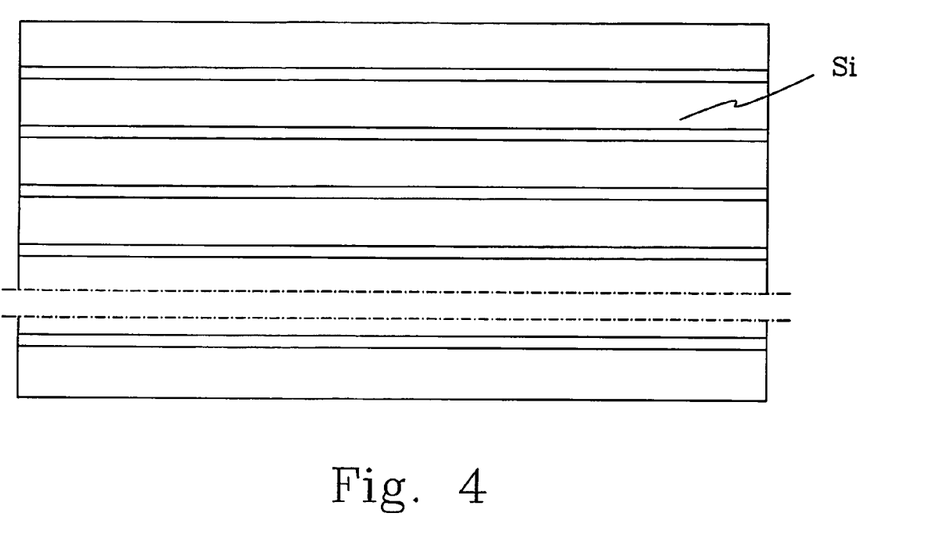
FIG. 4 illustrates an image comprising a plurality of overlapping strips.

An image is built up of a sequence of strips $s_i$ as illustrated in FIG. 4. The individual strips may or may not have the same width. The strips of an image may or may not be partially overlapped, similar to adjacent stamps of a strip as illustrated in FIG. 3. In a scanning pattern generator the stamps in FIG. 3 is interchanged with scanning lines, comprising a number of micro sweeps. The workpiece is supported on an object table, which is operative in x and y direction. The object table moves in the x direction preferably at a constant speed for producing strips of a given width when the laser beam scans along the scan lines. When respective strip is completed, an x servomechanism performs a retrace stroke movement into the starting position and the object table is then moved in a y direction by the width of a strip. Alternatively, when one strip is completed a new strip may be printed on the return stroke, thereby printing in a meandering fashion. The strips may also be printed in a stochastic fashion, i.e., two strips written after each other may not be located next to each other. Each scan line comprises a plurality of micro sweeps. Each scan line comprises one or a plurality of windows $w_i$ as illustrated in FIG. 5.

Figure 2A:
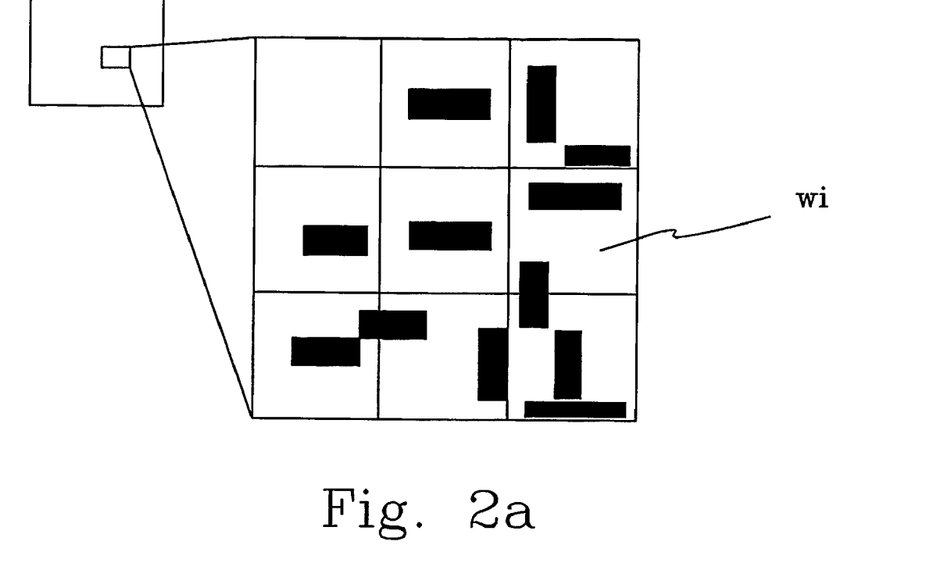
FIG. 2a illustrates an enlarged portion of the two dimensional pattern in FIG. 1c.

FIG. 2a illustrates an enlarged portion of a pattern to be imaged onto a workpiece. Said enlargement comprises 9 windows $w_i$. Said windows $w_i$ represent the rasterized format of the two dimensional pattern of area features as described in connection with FIG. 1c above. In this example the windows are illustrated to be squares, however any polygonal shape is possible. In the example illustrated in FIG. 2a all windows have equal size, however windows of unequal sizes are also possible.

Figure 2B:
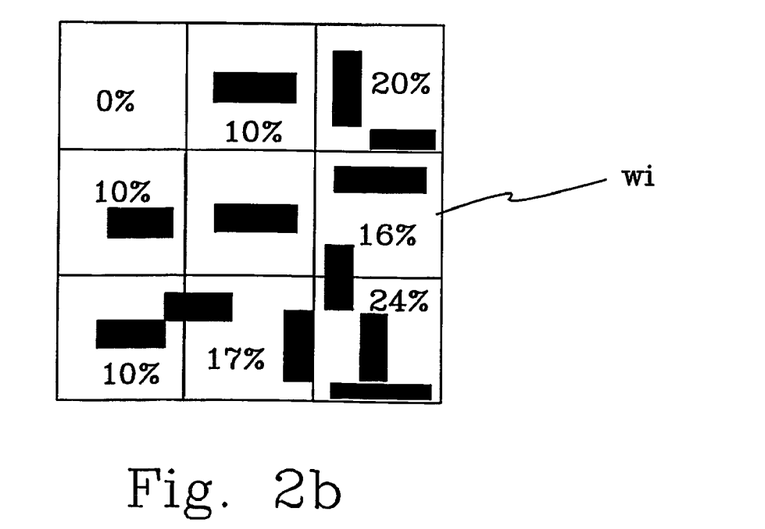
FIG. 2b depicts pattern densities for the resterized pattern.

In FIG. 2b a density calculation has been performed for the most adjacent windows to the central window, which is about to be written. The density calculation can be made as one value for each window (as in this example) or the window could be further divided into smaller parts and a density value for the smaller parts are calculated. For example, if the density exceeds a predetermined value when all windows are of a given size, the windows with the exceeded value could be further divided into smaller parts. In FIG. 2a only the density of the most adjacent windows is calculated. However, further windows could be calculated at the same time. For example windows next most adjacent to the window which is about to be written.

The density information of a given number of windows is collected into a feature corrector which may comprise an algorithm, which produces output information of how the object(s)/feature(s) in a particular window shall be sized. The mathematical expression for such a correction may be as follows $C=k*M(r)+m$, where C is the correction which is a vector, i.e. ($C_x$, $C_y$), k and m are a constants, $M(r)$ may be d/r, where d is a density of a particular window and r is a distance from a center of the window in which feature(s) is to be sized to the a center of said particular window in which the density has been calculated. Instead of using 1/r as a distance parameter one may also use $1/r^2$ or $1/r^3$. For example, one formula is applicable for most adjacent windows and other formulas for windows further away. The correction $C_x$ may or may not be equal to $C_y$. When $C_x$ is equal to $C_y$ an average density of a number of surrounding windows may be calculated and used in the correction/compensation.

In one embodiment of the invention the density calculation is performed for a portion of the windows $w_i$ before the printing/imaging of the pattern is started. Meanwhile said pattern is printed the densities of the remaining windows are calculated.

Using the Monte Carlo algorithm, which is well known for a man skilled in the art and therefore does not need any further explanation, may perform the density calculation. In a preferred embodiment said ordinary Monte Carlo method is modified with a random number generator in order not to miss features on specific locations in the window, due to the risk of interference between a pitch of the pattern and a pitch of the grid. One way of reducing the risk of missing features at specific locations is to randomly change the pitch of the grid. Alternatively said density calculation is made more accurately by calculating the size of each individual area feature.

Figure 2C:
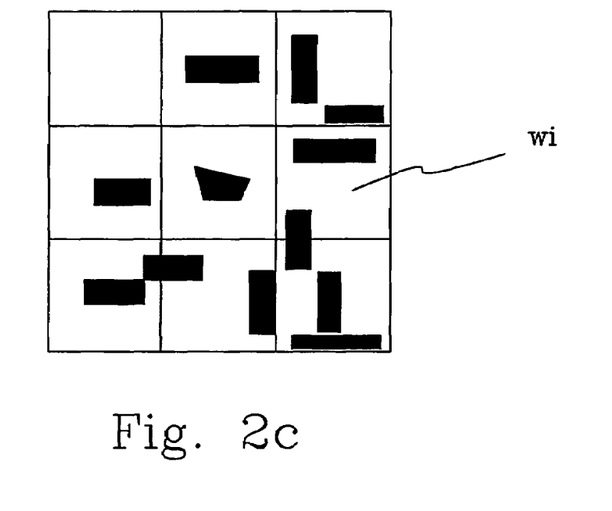
FIG. 2c illustrates corrected features/objects in a portion of the two dimensional pattern.

FIG. 2c illustrates the result of correcting/adjusting the features/objects in the central window depending on the density of the patterns in said window and at least one other window. As can be seen the object has been reduced in size in the direction of the more densely populated windows compared to the less populated windows. The correction is in FIG. 2c illustrated to be a size correction. However a dose correction or a combination of dose and size correction is also perfectly possible. When correcting the feature by size the shape of said feature will most likely be changed due to the fact that adjacent windows have different densities. A higher density will decrease the size more then a smaller one resulting in a distorted shape of the feature to be written.

In a preferred embodiment the operator, who is going to write a pattern by using a pattern generator, may by himself change the constants k and m, the parameter M(r) or the whole formula. This feature will greatly enhance the flexibility of a pattern generator, which gives the possibility for the operator to optimize said parameters in each individual case.

The pattern dependent correction may be combined with any other correction method, for example process dependent corrections and corrections which is generic all over the wafer/workpiece. All said corrections might be applied to the digital description of the pattern prior to writing said pattern onto the workpiece.

Figure 6:
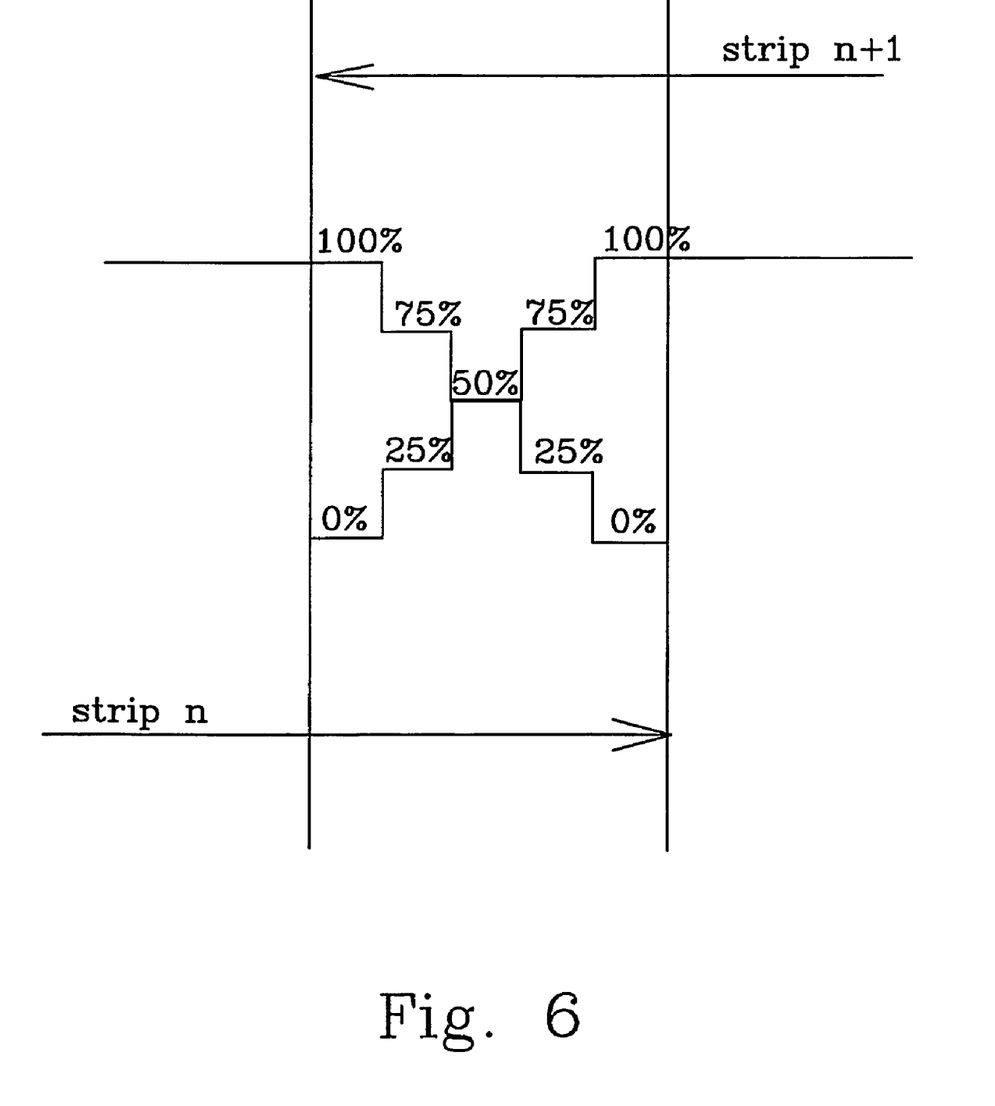
FIG. 6 illustrates an example of overlapping strips.

FIG. 6 illustrates the overlap region between two strips n and n+1. In this exemplifying embodiment a dose of electromagnetic radiation is ramped down in the overlapping region for strip n and ramped up for strip n+1. An original writing dose is held constant in a portion of the overlapping region for strip n as indicated in FIG. 6 with 100%. Said strip n in then ramped down to 75%, 50%, 25% and 0% of the original writing dose. 0% is reached a portion before said overlapping region is ended. Strip n+1 is ramped up from 0% to 25%, 50%, 75% and 100% of the writing dose. In strip n+10% dose is held constant a portion of the overlapping region, the same applies to said 100% of the writing dose, i.e., said dose is reached before said overlapping region is ended. By using this kind of writing strategy butting errors can be taken care of. The dose may be ramped differently, for example directly from 100% to 0% without any intermediate values. In general any number of ramping states may be used. Preferably the doses from the overlapping strips should end up in 100% of the intended writing dose, however due to some delays and aging phenomena said values may in different cases numerically be somewhat different than 100%. The dose may also be ramped according to any mathematical expression, including but not limited to exponential, parabolic, logarithmic etc.

While the preceding examples are cast in terms of a method, devices and systems employing this method are easily understood. A magnetic memory containing a program capable of practicing the claimed method is one such device. A computer system having memory loaded with a program practicing the claimed method is another such device.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method for adjusting a pattern to be imaged onto a workpiece, comprising the actions of:

dividing a pattern representing an image in a plurality of regions, computing a pattern density in said plurality of regions, adjusting at least one feature in at least one of said plurality of regions based on the pattern density in a region where said feature is located and in at least one other region, feeding an adjusted pattern to a modulator, creating the image on said workpiece by using said adjusted pattern, wherein the density is calculated for only a portion of the plurality of regions before the creation of said image commences.

2. The method according to claim 1, wherein said at least one other region is adjacent to the region in which said at least one feature is to be adjusted.

3. The method according to claim 1, wherein said at least one other region is non-adjacent to the region in which said at least one feature is to be adjusted.

4. The method according to claim 1, wherein other regions are both adjacent and non-adjacent to the region in which said at least one feature is to be adjusted.

5. The method according to claim 1, wherein said modulator is at least one Acoustic Optical Modulator (AOM).

6. The method according to claim 1, wherein said modulator is at least one Spatial Light Modulator (SLM).

7. The method according to claim 6, wherein said at least one SLM is illuminated by a pulsed electromagnetic radiation source.

8. The method according to claim 1, wherein said workpiece is a mask or a reticle.

9. The method according to claim 1, wherein said workpiece is a semi conducting substrate.

10. The method according to claim 1, wherein said regions are non-overlapping.

11. The method according to claim 1, wherein said regions are at least partly overlapping each other.

12. The method according to claim 1, wherein said at least one feature is adjusted by dose.

13. The method according to claim 1, wherein said at least one feature is adjusted by size.

14. The method according to claim 1, wherein said at least one feature is adjusted by size and dose.

15. The method according to claim 1, wherein said regions are of polygonal shape.

16. An apparatus for imaging adjusted pattern onto a workpiece, comprising an electromagnetic radiation source, a modulator to modulate said electromagnetic radiation according to a digital representation of the pattern to be imaged, a calculator to calculate pattern densities in plurality of regions, which said pattern is divided into, wherein said pattern densities are used to adjust at least one feature to be imaged depending on the density in a region where said feature is located and in at least one other region, wherein the calculator is adapted to calculate the pattern densities for a portion of the plurality of regions while the modulator is imaging another portion of the plurality of regions.

17. The apparatus according to claim 16, wherein said at least one other region is adjacent to the region in which said at least one feature is to be adjusted.

18. The apparatus according to claim 16, wherein said at least one other region is non-adjacent to the region in which said at least one feature is to be adjusted.

19. The apparatus according to claim 16, wherein regions are both adjacent and non-adjacent to the region in which said at least one feature is to be adjusted.

20. The apparatus according to claim 16, wherein said modulator is at least one Acoustic Optical Modulator (AOM).

21. The apparatus according to claim 16, wherein said modulator is at least one Spatial Light Modulator (SLM).

22. The apparatus according to claim 21, wherein said at least one SLM is illuminated by a pulsed electromagnetic radiation source.

23. The apparatus according to claim 16, wherein said workpiece is a mask or a reticle.

24. The apparatus according to claim 16, wherein said workpiece is a semi conducting substrate.

25. The apparatus according to claim 16, wherein said regions are non-overlapping.

26. The apparatus according to claim 16, wherein said regions are at least partly overlapping each other.

27. The apparatus according to claim 16, wherein said at least one feature is adjusted by dose.

28. The apparatus according to claim 16, wherein said at least one feature is adjusted by size.

29. The apparatus according to claim 16, wherein said at least one feature is adjusted by size and dose.

30. The method according to claim 16, wherein said regions are of polygonal shape.

\* \* \* \* \*